(12) United States Patent
Tagori et al.

(10) Patent No.: US 12,550,267 B2
(45) Date of Patent: Feb. 10, 2026

(54) METHOD FOR FORMING CONDUCTIVE THIN WIRE, METHOD FOR PRODUCING TRANSPARENT CONDUCTOR, METHOD FOR PRODUCING DEVICE, AND SET OF CONDUCTIVE INK AND BASE MATERIAL

(71) Applicant: Konica Minolta, Inc., Tokyo (JP)

(72) Inventors: Hirotaka Tagori, Kawasaki (JP); Masayoshi Yamauchi, Chofu (JP); Ryo Aoyama, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 1382 days.

(21) Appl. No.: 17/271,956

(22) PCT Filed: Aug. 27, 2018

(86) PCT No.: PCT/JP2018/031576
§ 371 (c)(1),
(2) Date: Feb. 26, 2021

(87) PCT Pub. No.: WO2020/044404
PCT Pub. Date: Mar. 5, 2020

(65) Prior Publication Data
US 2021/0329789 A1    Oct. 21, 2021

(51) Int. Cl.
*H05K 3/12* (2006.01)
*C09D 11/52* (2014.01)
(Continued)

(52) U.S. Cl.
CPC ............ *H05K 3/125* (2013.01); *C09D 11/52* (2013.01); *H01B 1/14* (2013.01); *H01B 13/0036* (2013.01);
(Continued)

(58) Field of Classification Search
CPC .. H05K 3/125; H05K 2203/013; H05K 1/092; H05K 2201/0108;
(Continued)

(56) References Cited

U.S. PATENT DOCUMENTS

| | | | |
|---|---|---|---|
| 2010/0200841 A1* | 8/2010 | Cheon | C09D 11/36 438/34 |
| 2016/0205775 A1* | 7/2016 | Uchida | H05K 3/1283 174/257 |

FOREIGN PATENT DOCUMENTS

| | | |
|---|---|---|
| JP | 2000309734 A | 11/2000 |
| JP | 2006212477 A | 8/2006 |

(Continued)

OTHER PUBLICATIONS

Machine Translation of Japanese Publication, JP 2006-212477, Mar. 2025. (Year: 2025).*

(Continued)

*Primary Examiner* — A. Dexter Tugbang
(74) *Attorney, Agent, or Firm* — CANTOR COLBURN LLP

(57) ABSTRACT

In a method for forming a conductive thin wire on a base material by an inkjet method using a conductive ink containing at least a main solvent having a boiling point equal to or lower than the boiling point of water, a solvent having a boiling point higher than that of water, and a conductive material, the base material has surface energy of less than 40 mN/m, and conditions of $30°≤θ1≤70°$, $0°≤θ2≤40°$, and $θ2<θ1$ are satisfied when a forward contact angle of the conductive ink to the base material is represented by $θ1$, and a backward contact angle of the conductive ink to the base material is represented by $θ2$.

14 Claims, 3 Drawing Sheets

(51) Int. Cl.
*H01B 1/14* (2006.01)
*H01B 13/00* (2006.01)
*H05K 1/09* (2006.01)
*H05K 13/00* (2006.01)
*H05K 3/10* (2006.01)

(52) U.S. Cl.
CPC .............. *H05K 1/092* (2013.01); *H05K 1/097* (2013.01); *H05K 3/10* (2013.01); *H05K 2203/013* (2013.01)

(58) Field of Classification Search
CPC ......... H05K 2201/09681; H05K 1/097; H05K 3/10; C09D 11/52; H01B 1/14; H01B 13/0036
See application file for complete search history.

(56) References Cited

FOREIGN PATENT DOCUMENTS

| JP | 2008510597 | A | | 4/2008 |
|----|------------|---|---|--------|
| JP | 2012020247 | A | | 2/2012 |
| JP | 2012252856 | A | * | 12/2012 |
| JP | 2014120353 | A | | 6/2014 |
| JP | 5924609 | B2 | | 5/2016 |
| JP | 2017117581 | A | | 6/2017 |
| JP | 2017216303 | A | | 12/2017 |
| JP | 2017224117 | A | | 12/2017 |
| JP | 2018041939 | A | | 3/2018 |
| WO | 2010029934 | A1 | | 3/2010 |
| WO | 2015111731 | A1 | | 7/2015 |
| WO | 2016170957 | A1 | | 10/2016 |
| WO | 2017104651 | A1 | | 6/2017 |
| WO | 2015083307 | A1 | | 3/2018 |

OTHER PUBLICATIONS

Machine Translation of Japanese Publication, JP 2017-117581, Mar. 2025. (Year: 2025).*
Mohan et al, "Cu complex inks for printed electronics application-challenges and solutions," Mikro-Nano-Integration; 9. GMM-Workshop, Aachen, Germany, 2022, pp. 1-5. (Year: 2022).*
CNIPA 1st Office Action for corresponding CN Application No. 2018009864.4; Issue Date, Apr. 27, 2023.
International Search Report for International Application No. PCT/JP2018/031576; Date of Mailing, Oct. 30, 2018.
PCT Written Opinion of the International Searching Authority for International Application No. PCT/JP2018/031576; Date of Mailing, Oct. 30, 2018.
EPO Extended Search Report for corresponding EP Application No. 18932102.9; Dated Jul. 9, 2021.
JPO Notice of Reasons for Refusal for corresponding JP Application No. 2020-539179; Issued on Jan. 4, 2020.

* cited by examiner

METHOD FOR FORMING CONDUCTIVE THIN WIRE, METHOD FOR PRODUCING TRANSPARENT CONDUCTOR, METHOD FOR PRODUCING DEVICE, AND SET OF CONDUCTIVE INK AND BASE MATERIAL

CROSS REFERENCE TO RELATED APPLICATIONS

The present invention claims priority under 35 U.S.C. § 119 to International Patent Application No. PCT/JP2018/031576, filed on Aug. 27, 2018, the entire contents of which are incorporated herein by reference.

TECHNICAL FIELD

The present invention relates to a method for forming a conductive thin wire, the method being capable of improving thin wire formability, conductivity, adhesion, and transmittance of a conductive thin wire, a method for producing a transparent conductor, a method for producing a device, and a set of a conductive ink and a base material.

BACKGROUND ART

A method for applying a conductive ink onto a base material for printing has been proposed (Patent Literatures 1 to 11).

CITATION LIST

Patent Literature

Patent Literature 1: JP 2014-120353 A
Patent Literature 2: JP 2017-117581 A
Patent Literature 3: JP 2000-309734 A
Patent Literature 4: JP 2017-216303 A
Patent Literature 5: WO 2016/170957
Patent Literature 6: JP 5924609 B2
Patent Literature 7: JP 2008-510597 A
Patent Literature 8: WO 2015/111731
Patent Literature 9: WO 2010/029934
Patent Literature 10: JP 2006-212477 A
Patent Literature 11 JP 2012-020247 A

SUMMARY OF INVENTION

Technical Problem

In the conventional technique, when a conductive thin wire is formed on a base material by an inkjet method using a conductive ink, a problem that it is difficult to improve thin wire formability, conductivity, adhesion, and transmittance has been found.

Therefore, an object of the present invention is to provide a method for forming a conductive thin wire, the method being capable of improving thin wire formability, conductivity, adhesion, and transmittance of a conductive thin wire, a method for producing a transparent conductor, a method for producing a device, and a set of a conductive ink and a base material.

Other objects of the present invention will become apparent from the following description.

Solution to Problem

The above objects are achieved by the following inventions.

1.
A method for forming a conductive thin wire on a base material by an inkjet method using a conductive ink containing at least a main solvent having a boiling point equal to or lower than the boiling point of water, a solvent having a boiling point higher than that of water, and a conductive material, in which
the base material has surface energy of less than 40 mN/m, and
conditions of $30°≤θ1≤70°$, $0°≤θ2≤40°$, and $θ2≤θ1$ are satisfied when a forward contact angle of the conductive ink to the base material is represented by $θ1$, and a backward contact angle of the conductive ink to the base material is represented by $θ2$.

2.
The method for forming a conductive thin wire according to the above item 1, in which a log P value of the solvent having a boiling point higher than that of water is larger than 0.

3.
The method for forming a conductive thin wire according to the above item 1 or 2, in which the base material has an undercoat layer containing at least a resin containing a hydrophobic acrylic resin skeleton.

4.
The method for forming a conductive thin wire according to any one of the above items 1 to 3, in which when droplets formed of the conductive ink applied onto the base material are dried, the base material is heated.

5.
The method for forming a conductive thin wire according to any one of the above items 1 to 4, in which when droplets formed of the conductive ink applied onto the base material are dried, the conductive material is selectively deposited on edges of the droplets to form the conductive thin wire.

6.
A method for producing a transparent conductor, in which a conductive thin wire constituting a transparent conductor is formed by the method for forming a conductive thin wire according to any one of the above items 1 to 5.

7.
A method for producing a device, in which a conductive thin wire constituting a device is formed by the method for forming a conductive thin wire according to any one of the above items 1 to 5.

8.
A set of a conductive ink and a base material, in which
the conductive ink contains at least a main solvent having a boiling point equal to or lower than the boiling point of water, a solvent having a boiling point higher than that of water, and a conductive material,
the base material has surface energy of less than 40 mN/m,
conditions of $30°≤θ1≤70°$, $0°≤θ2≤40°$, and $θ2≤θ1$ are satisfied when a forward contact angle of the conductive ink to the base material is represented by $θ1$, and a backward contact angle of the conductive ink to the base material is represented by $θ2$, and the set of the conductive ink and the base material is used for forming a conductive thin wire on the base material by an inkjet method using the conductive ink.

Advantageous Effects of Invention

The present invention can provide a method for forming a conductive thin wire, the method being capable of improving thin wire formability, conductivity, adhesion, and transmittance of a conductive thin wire, a method for producing a transparent conductor, a method for producing a device, and a set of a conductive ink and a base material.

DESCRIPTION OF EMBODIMENTS

Figure 1A:
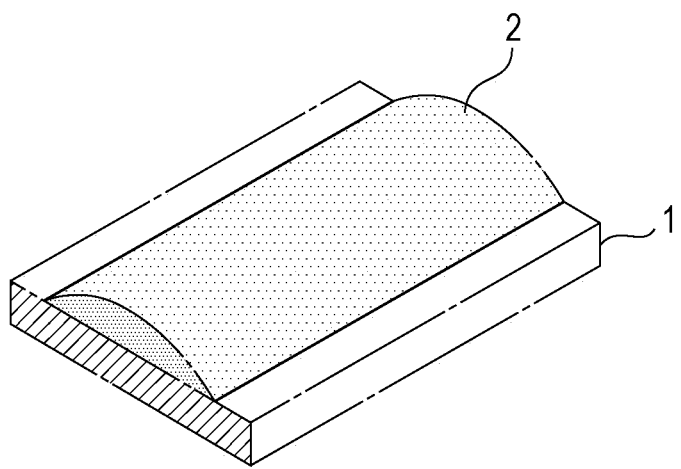
FIGS. 1A-FIG. 1B are diagrams for explaining an example of a method for forming a conductive thin wire.

Hereinafter, an embodiment for carrying out the present invention will be described in detail.

1. Method for Forming Conductive Thin Wire

A method for forming a conductive thin wire according to the present embodiment is a method for forming a conductive thin wire on a base material by an inkjet method using a conductive ink containing at least a main solvent having a boiling point equal to or lower than the boiling point of water, a solvent having a boiling point higher than that of water, and a conductive material, in which the base material has surface energy of less than 40 mN/m, and conditions of $30°≤θ1≤70°$, $0°≤θ2≤40°$, and $θ2≤θ1$ are satisfied when a forward contact angle of the conductive ink to the base material is represented by $θ1$, and a backward contact angle of the conductive ink to the base material is represented by $θ2$. As a result, thin wire formability, conductivity, adhesion, and transmittance of a conductive thin wire can be improved.

(1) Base Material

As the base material, a material is used in which surface energy is less than 40 mN/m and conditions of $30°≤θ1≤70°$, $0°≤θ2≤40°$, and $θ2≤θ1$ are satisfied when a forward contact angle of the conductive ink to the base material is represented by $θ1$, and a backward contact angle of the conductive ink to the base material is represented by $θ2$. The surface energy, the forward contact angle $θ1$, and the backward contact angle $θ2$ are values in an environment of 25° C. and 50% RH.

By satisfying these conditions for surface energy and contact angle, the effect of the present invention is favorably exhibited. A reason for this is presumed as follows.

By using a conductive ink satisfying a condition that the forward contact angle $θ1$ is $30°≤θ1≤70°$ for a hydrophobic base material having surface energy of less than 40 mN/m, wet spread of the conductive ink on a base material is suppressed, high packing (high stacking) of a conductive material constituting a conductive thin wire is possible, and conductivity and transmittance of the conductive thin wire are improved.

Normally, when a conductive ink exhibiting such a high forward contact angle $θ1$ as described above is used for such a base material having a low surface energy as described above, the ink is repelled by the hydrophobic base material when the conductive ink is dried on the base material, a bulge is generated in a conductive thin wire to be formed, and thin wire formability is unstable. Meanwhile, in the present embodiment, by further setting the backward contact angle $θ2$ of the conductive ink to a low value satisfying a condition of $0°≤θ2≤40°$, the conductive ink is less likely to be repelled during drying, generation of a bulge in the conductive thin wire is prevented, and thin wire formability is improved. Preventing generation of a bulge also contributes to further improvement of conductivity of the conductive thin wire.

In addition, an appropriate hydrophobic interaction occurs between the conductive ink exhibiting such contact angles as described above and the base material exhibiting low surface energy, and adhesion of the conductive thin wire is thereby also improved. Due to this adhesion, the conductive thin wire is prevented from being peeled from the base material, and conductivity can be stably exhibited. For example, even when a flexible base material is deformed, a conductive thin wire on the base material is prevented from being peeled.

The present applicant has disclosed in Patent Literature 1 that a conductive ink is applied to a base material having surface energy of 40 mN/m or more to form a conductive thin wire. This achieves both conductivity and transmittance, but it has been found that conductivity and transmittance can be further improved. That is, in the present invention, by intentionally using a base material having surface energy of less than 40 mN/m, which is normally considered to be unsuitable for forming a conductive thin wire, and satisfying the conditions of the forward contact angle $θ1$ and the backward contact angle $θ2$, conductivity and transmittance are further improved, and excellent adhesion is also exhibited.

The surface energy of the base material only needs to be less than 40 mN/m, and the upper limit thereof can be, for example, 39 mN/m or less, 38 mN/m or less, or furthermore 37 mN/m or less. The lower limit of the surface energy of the base material is not particularly limited, and can be, for example, 20 mN/m or more, 25 mN/m or more, 30 mN/m or more, 31 mN/m or more, 32 mN/m or more, or furthermore 33 mN/m or more.

The forward contact angle $θ1$ only needs to satisfy $30°≤θ1≤70°$, and the upper limit thereof can be, for example, 65° or less, 60° or less, or furthermore 55° or less. The lower limit of the forward contact angle $θ1$ can be, for example, 35° or more, 40° or more, 45° or more, or furthermore 50° or more.

The backward contact angle $θ2$ only needs to satisfy $0°≤θ2≤40°$, and the upper limit thereof can be, for example, 36° or less, 34° or less, 32° or less, or furthermore 30° or less. The lower limit of the backward contact angle $θ2$ can be, for example, 5° or more, 10° or more, 12° or more, or furthermore 14° or more.

The forward contact angle $θ1$ and the backward contact angle $θ2$ satisfy the condition of $θ2≤θ1$ as described above. At this time, a difference between the forward contact angle $θ1$ and the backward contact angle $θ2$ (also referred to as "hysteresis") is not particularly limited, but is preferably set to be large, and $θ1-θ2$ can be, for example, 5° or more, 10° or more, 15° or more, 20° or more, 25° or more, or furthermore 30° or more. By using a base material having surface energy of less than 40 mN/m, satisfying the above-described conditions for the forward contact angle $θ1$ and the backward contact angle $θ2$, and setting the hysteresis to such a large value, the effect of the present invention is exhibited more favorably. The upper limit of θ1-θ2 is not particularly limited, and can be, for example, 50° or less, 45° or less, or furthermore 40° or less.

The base material may be any material as long as a surface on which a conductive thin wire is formed satisfies the above-described conditions for surface energy and contact angle.

The base material may have either a single-layer structure or a laminated structure, but preferably has a laminated structure. The base material having a laminated structure can satisfy the above-described conditions for surface energy and contact angle due to the configuration of a surface layer (also referred to as "undercoat layer") on which a conductive thin wire is formed. In this case, materials constituting layers other than the undercoat layer can be freely selected. Therefore, this is advantageous to impart desired physical properties to the base material.

The undercoat layer preferably contains a resin. Surface energy and contact angle of the undercoat layer containing a resin can be easily adjusted by designing a polymer, combining a plurality of resins, blending additives, and the like, and the above-described conditions for surface energy and contact angle can be suitably satisfied.

The resin constituting the undercoat layer is not particularly limited, and examples thereof include an acrylic resin and a polyester-based resin.

The acrylic resin can contain one or more monomers used in production of a general acrylic resin as a monomer component. Examples of such a monomer include a carboxyl group-containing monomer, a hydroxyl group-containing monomer, and a (meth)acrylate.

Examples of the carboxyl group-containing monomer include (meth)acrylic acid, itaconic acid, crotonic acid, and maleic acid.

Examples of the hydroxy group-containing monomer include hydroxyethyl (meth)acrylate, hydroxypropyl (meth)acrylate, and N-methylol (meth)acrylamide.

Examples of the (meth)acrylate include an alkyl (meth)acrylate, in which an alkyl group constituting the ester has 3 or less carbon atoms.

As the monomer component constituting the acrylic resin, for example, (meth)acrylonitrile, (meth)acrylamide, N-methoxy (meth)acrylamide, allyl (meth)acrylate, styrene, vinyl toluene, glycidyl methacrylate, or dicyclopentenyl methacrylate may be used.

As an example of the acrylic resin, a crosslinked acrylic resin is preferably used. Crosslinking may be formed by separately applying a crosslinking agent to the acrylic resin, but is preferably formed by using a monomer capable of forming crosslinking as a monomer component of the acrylic resin.

For example, by copolymerizing a hydrophilic group-containing monomer and a reactive group-containing monomer capable of attacking the hydrophilic group to form crosslinking as monomer components, and forming crosslinking, a crosslinked acrylic resin can be obtained.

Examples of the hydrophilic group-containing monomer include the above-described carboxyl group-containing monomer and hydroxy group-containing monomer. Meanwhile, examples of the reactive group-containing monomer include glycidyl methacrylate.

At this time, by copolymerizing an excess amount of hydrophilic group-containing monomer, for example, in the number of moles with the reactive group-containing monomer, a hydrophilic moiety derived from a hydrophilic group remaining without being crosslinked and a hydrophobic moiety derived from a hydrophilic group consumed by crosslinking can be mixed in the crosslinked acrylic resin.

By mixing the hydrophobic moiety and the hydrophilic moiety on the surface of the undercoat layer in this way, a difference between the forward contact angle θ1 and the backward contact angle θ2 of the conductive ink, that is, the hysteresis is large, wet spread of the conductive ink is further suppressed, and the conductive ink is less likely to be repelled during drying. As a result, the effect of the present invention is exhibited more favorably, and in particular, thin wire formability and conductivity of a conductive thin wire are further improved.

The undercoat layer preferably contains at least a resin containing a hydrophobic acrylic resin skeleton. As a result, the above-described hysteresis can be further increased, and the effect of the present invention can be exhibited more favorably. Examples of the resin containing a hydrophobic acrylic resin skeleton include an acrylic resin into which a hydrophobic group has been introduced.

The hydrophobic group is not particularly limited as long as enhancing hydrophobicity of the acrylic resin. For example, a linear, branched, or cyclic and saturated or unsaturated hydrocarbon group having 4 or more carbon atoms, preferably 4 to 30 carbon atoms, more preferably 8 to 20 carbon atoms is suitable.

Examples of the saturated hydrocarbon group include a dodecyl group.

Examples of the unsaturated hydrocarbon group include an unsaturated hydrocarbon group derived from an unsaturated fatty acid such as a drying oil fatty acid, a semi-drying oil fatty acid, or a dehydrated castor oil fatty acid, an allyl group, and a dicyclopentenyl group.

The hydrophobic group is preferably introduced into the acrylic resin as a side chain. For example, the hydrophobic group is preferably linked as an ester to a carboxy group constituting the acrylic resin. Such an acrylic resin can contain a hydrophobic group-containing (meth)acrylic monomer represented by the following formula 1 as a monomer component.

$$CH_2=CR^1-COOR^2 \quad \text{(Formula 1)}$$

[In Formula 1, $R^1$ represents H or $CH_3$, and $R^2$ represents a hydrophobic group or a group containing the hydrophobic group.]

In the above formula 1, when $R^2$ is a group containing a hydrophobic group, examples of such a group include groups represented by the following formulas 2 to 6.

$$-CH_2CH(OH)CH_2OOCR^3 \quad \text{(formula 2)}$$

$$-CH_2CH(OOCR^3)CH_2OH \quad \text{(formula 3)}$$

$$-CH_2CH(OH)CH_2OR^3 \quad \text{(formula 4)}$$

$$-CH_2CH(OR^3)CH_2OH \quad \text{(formula 5)}$$

$$-CH_2CH_2N(CH_3)OOCR^3 \quad \text{(formula 6)}$$

[In formulas 2 to 6, $R^3$ represents a hydrophobic group.]

The acrylic resin into which a hydrophobic group has been introduced can contain one or more hydrophobic group-containing (meth)acrylic monomers as a monomer component.

In addition, the acrylic resin into which a hydrophobic group has been introduced may be a copolymer of one or more hydrophobic group-containing (meth)acrylic monomers and one or more other monomers as monomer components. The other monomer is a monomer not containing a hydrophobic group, and for example, one or more monomers can be selected from the monomers exemplified for the acrylic resin to be used.

By using a hydrophobic group-containing (meth)acrylic monomer and a monomer not containing a hydrophobic group in combination, a hydrophobic moiety derived from the hydrophobic group-containing (meth)acrylic monomer and a hydrophilic moiety derived from the monomer not containing a hydrophobic group can be mixed in the acrylic resin. In such an acrylic resin, a hydrophobic group, preferably a hydrophobic group introduced into a side chain causes microlayer separation. As a result, distribution of the hydrophobic moiety and the hydrophilic moiety on the surface of the undercoat layer is more non-uniform, the above-described hysteresis can be further increased, and the effect of the present invention can be exhibited more favorably.

A ratio of the hydrophobic group-containing (meth)acrylic monomer in the acrylic resin into which a hydrophobic group has been introduced is not particularly limited, but can be, for example, 5 to 40% by weight, 8 to 25% by weight, or furthermore 10 to 15% by weight with respect to the total weight of the monomers. When the ratio of the hydrophobic group-containing (meth)acrylic monomer is 5% by weight or more, the surface of the undercoat layer can be suitably non-uniform. When the ratio of the hydrophobic group-containing (meth)acrylic monomer is 40% by weight or less, the surface of the undercoat layer is prevented from becoming excessively hydrophobic, and an appropriate hydrophobic interaction is exhibited to the conductive ink to further improve adhesion of a conductive thin wire.

In the above description, the case where the acrylic resin into which a hydrophobic group has been introduced contains a hydrophobic group-containing (meth)acrylic monomer has been mainly described, but the present invention is not limited thereto. In the acrylic resin into which a hydrophobic group has been introduced, the hydrophobic group may be introduced into the acrylic resin by a copolymerization monomer other than the (meth)acrylic monomer.

The undercoat layer may contain a resin mixture containing an acrylic resin into which a hydrophobic group has been introduced and another resin. As a result, an undercoat layer having a sea-island structure containing a hydrophilic moiety and a hydrophobic moiety is formed, and distribution of the hydrophobic moiety and the hydrophilic moiety on the surface of the undercoat layer is more non-uniform, the above-described hysteresis can be further increased, and the effect of the present invention can be exhibited more favorably.

As the other resin to be mixed with the acrylic resin into which a hydrophobic group has been introduced, it is preferable to use a resin having a lower hydrophobicity (higher hydrophilicity) than the acrylic resin into which a hydrophobic group has been introduced, and examples thereof include an acrylic resin and a polyester-based resin.

A ratio of the hydrophobic group-containing (meth)acrylic monomer in such a resin mixture is not particularly limited, but can be, for example, 5 to 40% by weight, 8 to 25% by weight, or furthermore 10 to 15% by weight with respect to the total weight of the monomers in the resin mixture. Here, the total weight of the monomers in the resin mixture is the total weight of a monomer of the acrylic resin into which a hydrophobic group has been introduced and a monomer of the other resin. When the ratio of the hydrophobic group-containing (meth)acrylic monomer is 5% by weight or more, the surface of the undercoat layer can be suitably non-uniform. When the ratio of the hydrophobic group-containing (meth)acrylic monomer is 40% by weight or less, the surface of the undercoat layer is prevented from becoming excessively hydrophobic, and an appropriate hydrophobic interaction is exhibited to the conductive ink to further improve adhesion of a conductive thin wire.

The resin mixture described above is not necessarily limited to a resin mixture containing an acrylic resin into which a hydrophobic group has been introduced, and only needs to be a combination of resins different from each other, more preferably a combination of resins having different degrees of hydrophobicity from each other, most preferably a resin mixture containing a hydrophobic resin and a resin having a lower hydrophobicity (higher hydrophilicity) than the hydrophobic resin.

The undercoat layer may contain a resin having a core-shell structure. Such a core-shell structure can be constituted by, for example, a core formed of a hydrophobic moiety and a shell formed of a hydrophilic moiety. By using a resin having a core-shell structure, an undercoat layer having a sea-island structure containing a hydrophilic moiety and a hydrophobic moiety is also formed, and distribution of the hydrophobic moiety and the hydrophilic moiety on the surface of the undercoat layer is more non-uniform, the above-described hysteresis can be further increased, and the effect of the present invention can be exhibited more favorably.

The resin described above can be easily produced by a production method (synthesis method) known per se, and for example, the methods described in JP 7-118356 A and JP 2010-143955 A can be used.

In the above description, the case where the hydrophobic moiety and the hydrophilic moiety are mixed on the surface of the undercoat layer due to the configuration of the resin itself constituting the undercoat layer has been described, but the present invention is not limited thereto.

For example, by blending a repellent with the resin constituting the undercoat layer, the hydrophobic moiety and the hydrophilic moiety can also be mixed on the surface of the undercoat layer.

The repellent is not particularly limited, and examples thereof include wax.

The resin is not particularly limited, and a resin having a higher hydrophilicity than the repellent is preferably used, and examples thereof include an acrylic resin and a polyester-based resin.

The content of the repellent in the undercoat layer is not particularly limited, and can be, for example, 0.1 to 5% by weight, 1 to 4.5% by weight, or furthermore 2 to 4% by weight with respect to the total weight of the undercoat layer.

The thickness of the undercoat layer is not particularly limited, and can be, for example, 10 nm to 10 µm, or furthermore 100 nm to 5 µm.

In the above description, the case where the hysteresis of the contact angle is increased by mixing the hydrophobic moiety and the hydrophilic moiety on the surface of the undercoat layer has been mainly described, but the present invention is not limited thereto.

For example, the hysteresis of the contact angle can be increased by using permeability of the conductive ink into the surface of the undercoat layer.

The undercoat layer can contain a resin that can be swelled by a solvent having a boiling point higher than that of water contained in the conductive ink from a viewpoint of suitably using the permeability of the conductive ink, in which the following swelling ratio A of the resin is preferably 1 to 50%, and more preferably 5 to 40%.

$$\text{Swelling ratio } A\ (\%) = \{(w_1/w_0) - 1\} \times 100$$

Here, $w_0$ represents the weight (g) of the resin after the resin is dried at 80° C. for eight hours and then dried at room temperature (25° C.) for one day, and $w_1$ is the weight (g) of the resin after the dried resin is put in pure water, sealed, and immersed in the pure water with a constant temperature bath at 68° C. for two hours.

When the conductive ink contains a plurality of solvents each having a boiling point higher than that of water, a resin that can be swelled by any one solvent, preferably a solvent contained in the largest amount as a solvent having a boiling point higher than that of water, preferably a resin satisfying the above-described condition of the swelling ratio A can be used.

A method for forming the undercoat layer is not particularly limited, and various film forming methods such as a coating method can be used.

For example, the above-described undercoat layer can be formed on the base material as a pretreatment before the conductive ink is applied onto the base material by an inkjet method. In this case, the undercoat layer can be formed by applying a coating liquid (also referred to as "pretreatment liquid") containing a component for forming the undercoat layer, preferably a resin onto the base material.

The pretreatment liquid can contain the resin as resin microparticles.

When the undercoat layer contains a repellent, the pretreatment liquid can further contain the repellent.

A solvent used for the pretreatment liquid is not particularly limited, and one or more solvents selected from water and organic solvents can be used, and water is particularly preferably used.

The content of the resin in the pretreatment liquid is not particularly limited, can be appropriately set in consideration of coatability, film formability, and the like, and can be, for example, 1 to 50% by weight, 5 to 30% by weight, or furthermore 10 to 20%.

In the base material having the undercoat layer, a material constituting a layer other than the undercoat layer is not particularly limited, and examples thereof include glass, resin, metal (copper, nickel, aluminum, iron, or the like, or alloy), and ceramics. For example, these materials may be used singly or in a state where a plurality of types of the materials is bonded to each other.

As a material constituting a layer other than the undercoat layer, a resin is particularly preferably used. At this time, the undercoat layer also preferably contains a resin.

A material of the resin constituting a layer other than the undercoat layer is not particularly limited, and examples thereof include a polyethylene terephthalate (PET) resin, a polyethylene naphthalate (PEN) resin, a polybutylene terephthalate resin, a cellulose-based resin (polyacetyl cellulose, cellulose diacetate, cellulose triacetate, and the like), a polyethylene resin, a polypropylene-based resin, a methacrylic resin, a cyclic polyolefin-based resin, a polystyrene-based resin, an acrylonitrile-(poly) styrene copolymer (AS resin), an acrylonitrile-butadiene-styrene copolymer (ABS resin), a polyvinyl chloride-based resin, a poly (meth)acrylic resin, a polycarbonate-based resin, a polyester-based resin, a polyimide-based resin, a polyamide-based resin, a polyamideimide-based resin, and a cycloolefin polymer (COP) resin. By using these materials, favorable transparency can be imparted to the base material. In addition, particularly by using a synthetic resin material, favorable flexibility can be imparted to the base material. The base material containing a synthetic resin material can be in a form of a film, and the film may be stretched or unstretched.

The shape of the base material is not particularly limited, and can be, for example, a plate shape (plate material). When the base material is a plate material, the thickness, size (area), and shape are not particularly limited, and can be appropriately determined depending on an application and a purpose. The thickness of the plate material is not particularly limited, and can be, for example, about 1 μm to 10 cm, or furthermore about 20 μm to 300 μm.

A transparent base material is suitably used as the base material. The degree of transparency of the transparent base material is not particularly limited. The light transmittance of the transparent base material may be any value of several % to several tens %, and the spectral transmittance thereof may be any value. The light transmittance and the spectral transmittance can be appropriately determined depending on an application and a purpose. For example, glass, resin, or the like can be selected as a material of the base material from a viewpoint of imparting favorable transparency to the base material.

A surface of the base material is preferably insulating. For example, when the undercoat layer is an insulating layer, a layer other than the undercoat layer in the base material can contain an insulating material, a conductive material, or a combination thereof.

In the above description, the base material having the undercoat layer has been mainly described, but as described above, the base material may have a single layer structure. With at least one configuration described for the undercoat layer in a single layer of the base material having the single layer structure, the effect of the present invention can be suitably exhibited.

(2) Conductive Ink

The conductive ink contains at least a main solvent having a boiling point equal to or lower than the boiling point of water, a solvent having a boiling point higher than that of water (hereinafter, also simply referred to as "high boiling point solvent"), and a conductive material.

The main solvent having a boiling point equal to or lower than the boiling point of water is a main component of the solvent contained in the conductive ink, and is a solvent having the highest content (weight) among the solvents contained in the conductive ink.

Note that when the conductive ink contains two or more solvents each having a boiling point equal to or lower than the boiling point of water at the same content, a solvent having the lowest boiling point among these solvents is used as the main solvent.

The main solvent is preferably a hydrophilic solvent, and examples thereof include water and ethanol, and water is particularly preferable. As a result, the effect of the present invention to suitably suppress wet spread of the conductive ink on the hydrophobic base material is favorably exhibited.

The content of the main solvent in the conductive ink is preferably, for example, 30% by weight or more, 40% by weight or more, 50% by weight or more, or furthermore 60% by weight or more. This suppresses wet spread of the conductive ink on the base material, makes high packing of a conductive material constituting a conductive thin wire possible, and improves conductivity and transmittance of the conductive thin wire. The content of the main solvent in the conductive ink is preferably, for example, 90% by weight or less, 80% by weight or less, 75% by weight or less, or furthermore 70% by weight or less. This makes it possible for the conductive ink to contain a sufficient amount of the high boiling point solvent described later, makes the conductive ink less likely to be repelled during drying, prevents generation of a bulge in the conductive thin wire, and improves thin wire formability. Preventing generation of a bulge also contributes to further improvement of conductivity of the conductive thin wire.

The high boiling point solvent is not particularly limited as long as having a boiling point higher than that of water, and for example, a solvent having a boiling point higher than that of water can be selected from various solvents such as an alcohol and an ether.

As the alcohol, for example, a diol is preferable, and examples thereof include 1,2-pentanediol, 1,2-hexanediol, 2-methyl-2,4-pentanediol, 1,3-butanediol, 1,4-butanediol, and propylene glycol.

Examples of the ether include diethylene glycol monomethyl ether, diethylene glycol monoethyl ether, diethylene glycol monobutyl ether, triethylene glycol monomethyl ether, dipropylene glycol monomethyl ether, dipropylene glycol monoethyl ether, and tripropylene glycol monomethyl ether.

The high boiling point solvents can be used singly or in combination of two or more types thereof.

The conductive ink preferably contains one or more solvents each having a log P value larger than 0 as the high boiling point solvent.

The log P value is known as a logarithmic value of a distribution coefficient of 1-octanol/water. The distribution coefficient P of 1-octanol/water is a ratio between the equilibrium concentration of a compound in 1-octanol and the equilibrium concentration of the compound in water at distribution equilibrium when a minute amount of the compound is dissolved as a solute in a solvent of two liquid phases of 1-octanol and water, and is represented by a logarithm log P thereof with respect to a bottom 10. Measurement temperature for the log P value can be 25° C. A solvent having a log P value larger than 0 can be said to be highly hydrophobic.

A conductive ink containing a high boiling point solvent having a log P value larger than 0, that is, a highly hydrophobic high boiling point solvent more suitably exhibits a hydrophobic interaction on a hydrophobic base material having surface energy of less than 40 mN/m, and therefore adhesion of a conductive thin wire is further improved.

The content of the high boiling point solvent in the conductive ink is preferably, for example, 70% by weight or less, 60% by weight or less, 50% by weight or less, or furthermore 40% by weight or less. This makes it possible for the conductive ink to contain a sufficient amount of the main solvent described above, suppresses wet spread of the conductive ink on the base material, makes high packing of a conductive material constituting a conductive thin wire possible, and improves conductivity and transmittance of the conductive thin wire. The content of the high boiling point solvent in the conductive ink is preferably, for example, 5% by weight or more, 10% by weight or more, 15% by weight or more, or furthermore 20% by weight or more. This makes the conductive ink less likely to be repelled during drying, prevents generation of a bulge in a conductive thin wire, and improves thin wire formability. Preventing generation of a bulge also contributes to further improvement of conductivity of the conductive thin wire. The content of the high boiling point solvent referred to here is the total content of one or more high boiling point solvents contained in the conductive ink.

The conductive material is not particularly limited, and examples thereof include conductive microparticles and a conductive polymer.

Examples of the conductive microparticles include metal microparticles and carbon microparticles.

Examples of a metal constituting the metal microparticles include Au, Pt, Ag, Cu, Ni, Cr, Rh, Pd, Zn, Co, Mo, Ru, W, Os, Ir, Fe, Mn, Ge, Sn, Ga, and In. Among these metals, Au, Ag, and Cu are preferable, and Ag is particularly preferable. The average particle diameter of the metal microparticles can be, for example, 1 to 100 nm, or furthermore 3 to 50 nm. The average particle diameter is a volume average particle diameter, which can be measured by "Zetasizer 1000HS" manufactured by Malvern Instruments.

Examples of the carbon microparticles include graphite microparticles, carbon nanotube, and fullerene.

The conductive polymer is not particularly limited, but preferable examples thereof include a π-conjugated conductive polymer. Examples of the π-conjugated conductive polymer include a polythiophene and a polyaniline. The π-conjugated conductive polymer may be used together with a polyanion such as polystyrene sulfonic acid.

The concentration of the conductive material in the conductive ink can be, for example, 40% by weight or less, 30% by weight or less, or furthermore 20% by weight or less. In particular, when a coffee stain phenomenon described later is used, the concentration of the conductive material in the conductive ink can be, for example, 10% by weight or less, 8% by weight or less, 5% by weight or less, or furthermore 3% by weight or less. The concentration of the conductive material in the conductive ink can be, for example, 0.01% by weight or more, 0.05% by weight or more, 0.1% by weight or more, or furthermore 0.5% by weight or more.

The conductive ink can contain another component such as a surfactant. The surfactant is not particularly limited, and examples thereof include a silicon-based surfactant. The concentration of the surfactant in the conductive ink can be, for example, 1% by weight or less.

The conductive ink can appropriately contain a component other than the components described above as necessary as long as the effect of the present invention is not impaired.

(3) Inkjet Method

The above-described conductive ink is applied onto the above-described base material by an inkjet method. A droplet discharge method of an inkjet head in the inkjet method is not particularly limited, and examples thereof include a piezo method and a thermal method.

In the inkjet method, droplets of the conductive ink discharged from an inkjet head can be landed on the base material to form a desired image.

As an example, first, a plurality of droplets is arranged on the base material at intervals along a predetermined line, and the droplets are dried to form a plurality of dots along the predetermined line. Next, by arranging droplets on the base material so as to connect the plurality of dots to each other and drying the droplets, a conductive thin wire along the predetermined line can be formed. In this case, by suppressing wet spread of the conductive ink on the base material and preventing repelling, the dimensions (for example, diameter) of the conductive ink applied as droplets are uniform, and favorable thin wire formability is exhibited.

As another example, by causing droplets to coalesce in a line shape on the base material to form a line-shaped liquid and drying the line-shaped liquid, a conductive thin wire can be formed. In this case, by suppressing wet spread of the conductive ink on the base material and preventing repelling, the line width of the line-shaped liquid is uniform, and favorable thin wire formability is exhibited.

In the above-described example, from one line-shaped liquid, one conductive thin wire having the same line width as the line width of the line-shaped liquid may be formed, but parallel lines formed of a pair of conductive thin wires may be formed by using the coffee stain phenomenon described later.

When droplets formed of the conductive ink and applied onto the base material are dried, it is preferable to selectively deposit the conductive material on edges of the droplets to form a conductive thin wire, for example, by using the coffee stain phenomenon. An example of a method for forming a conductive thin wire by using the coffee stain phenomenon will be described below with reference to FIG. 1A-FIG. 1B.

As illustrated in FIG. 1A, a line-shaped liquid 2 formed of the conductive ink is applied onto a base material 1 by the inkjet method. The line-shaped liquid 2 can be formed by causing droplets of the conductive ink discharged from an inkjet head (not illustrated) to coalesce on the base material 1. Here, the line-shaped liquid 2 is formed on an undercoat layer 11 of the base material 1.

Figure 1B:
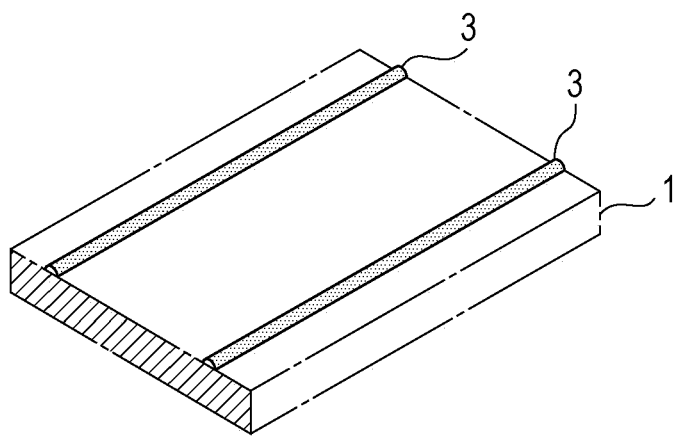

Subsequently, by selectively depositing the conductive material on an edge of the line-shaped liquid 2 in a process of drying the line-shaped liquid 2, as illustrated in FIG. 1B, a conductive thin wire 3 can be formed. In this example, by selectively depositing the conductive material on both edges of the line-shaped liquid 2 in a longitudinal direction, a pair of conductive thin wires 3 and 3 is formed. In the present embodiment, by suppressing wet spread of the conductive ink and preventing generation of a bulge, the line width of the line-shaped liquid 2 can be uniformly formed, and the pair of conductive thin wires 3 and 3 can be thereby formed in parallel with each other with high accuracy.

The line width of the conductive thin wire 3 is narrower than the line width of the line-shaped liquid 2, and can be, for example, 20 µm or less, 10 µm or less, 8 µm or less, or furthermore 5 µm or less. This can make the conductive thin wire 3 hardly visible, and also improves transmittance. In the present embodiment, even when the conductive thin wire 3 having such a thin line width is formed, movement of a contact line (edge position) of the line-shaped liquid 2 in a drying process is prevented. Therefore, high packing of the conductive material is possible, and the conductive thin wire 3 having excellent conductivity can be obtained. Furthermore, since the conductive thin wire 3 has excellent adhesion to the base material 1, for example, even when the flexible base material 1 is deformed, the conductive thin wire 3 is prevented from being peeled from the base material 1, and stable conductivity can be maintained.

Various patterns can be formed by one or more conductive thin wires 3. Examples of such a pattern include a stripe pattern and a mesh pattern. A first aspect of mesh pattern formation will be described below with reference to FIGS. 2A-FIG. 2D, and then s second aspect of the mesh pattern formation will be described with reference to FIGS. 3A-FIG. 3E.

Figure 2A:
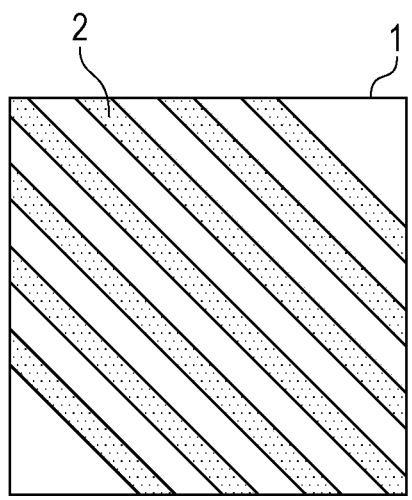
FIGS. 2A-FIG. 2D are diagrams illustrating a first aspect of mesh pattern formation.

In the first aspect of the mesh pattern formation, first, as illustrated in FIG. 2A, a plurality of line-shaped liquids 2 arranged side by side at predetermined intervals is formed on the base material 1.

Figure 2B:
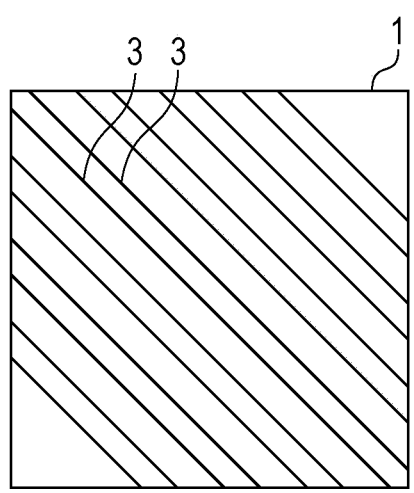

Subsequently, as illustrated in FIG. 2B, a pair of conductive thin wires 3 and 3 is formed from each of the line-shaped liquids 2 by using the coffee stain phenomenon when the line-shaped liquids 2 are dried.

Figure 2C:
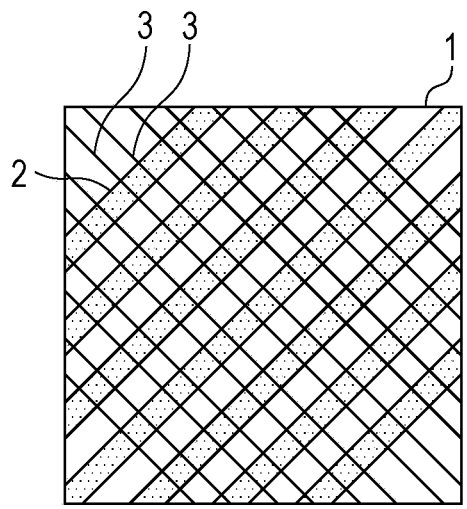

Subsequently, as illustrated in FIG. 2C, a plurality of line-shaped liquids 2 arranged side by side at predetermined intervals is formed so as to intersect with the plurality of conductive thin wires 3 formed earlier.

Figure 2D:
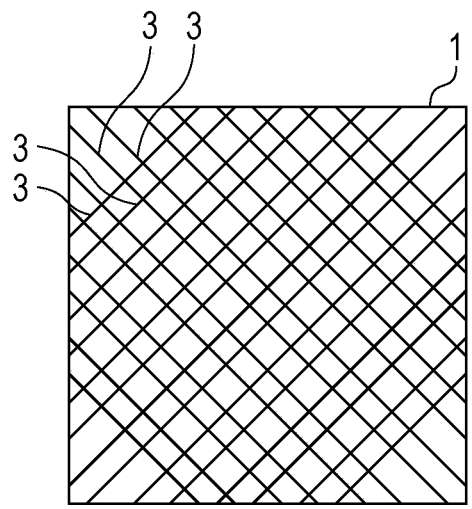

Subsequently, as illustrated in FIG. 2D, a pair of conductive thin wires 3 and 3 is formed from each of the line-shaped liquids 2 by using the coffee stain phenomenon when the line-shaped liquids 2 are dried. The mesh pattern can be formed as described above.

In the example of FIGS. 1A-FIG. 1B and FIG. 2A-FIG. 2D, the line-shaped liquid 2 and the conductive thin wire 3 are straight lines, but the present invention is not limited thereto. The shapes of the line-shaped liquid 2 and the conductive thin wire 3 may be, for example, a wavy line or a polygonal line (zigzag line).

Figure 3A:
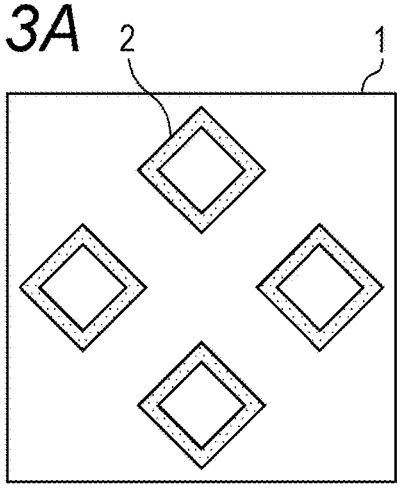
FIGS. 3A-FIG. 3E are diagrams illustrating a second aspect of mesh pattern formation.

In the second aspect of the mesh pattern formation, first, as illustrated in FIG. 3A, a plurality of line-shaped liquids 2 each forming a quadrangle and arranged side by side at predetermined intervals in a longitudinal direction (vertical direction in the drawing) of the base material 1 and in a width direction (horizontal direction in the drawing) thereof is formed on the base material 1.

Figure 3B:
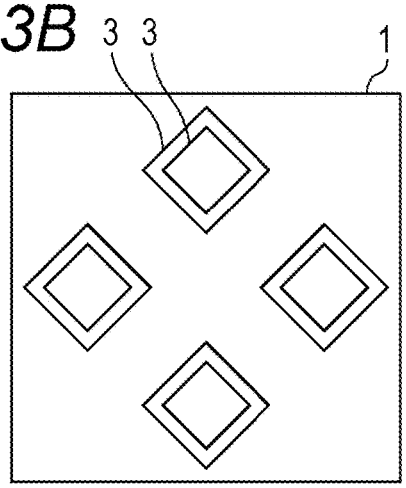

Subsequently, as illustrated in FIG. 3B, a thin wire unit formed of a pair of conductive thin wires 3 and 3 is formed from each of the line-shaped liquids 2 by using the coffee stain phenomenon when the line-shaped liquids 2 are dried. In such a thin wire unit, one of the conductive thin wires 3 and 3 (outer conductive thin wire 3) includes the other (inner conductive thin wire 3) inside, and the conductive thin wires 3 and 3 are formed concentrically. The conductive thin wires 3 and 3 form quadrangles corresponding to the shapes of both edges (inner peripheral edge and outer peripheral edge) of the line-shaped liquid 2, respectively.

Figure 3C:
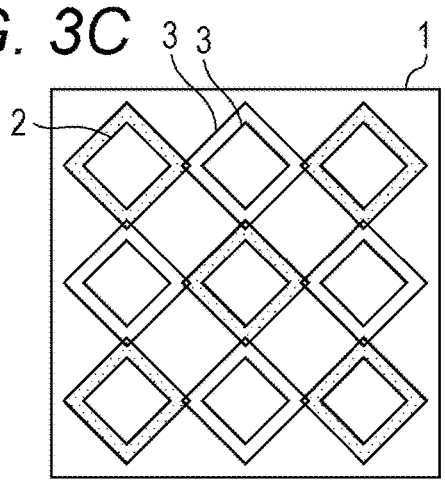

Subsequently, as illustrated in FIG. 3C, a plurality of line-shaped liquids 2 each forming a quadrangle and arranged side by side at predetermined intervals in the longitudinal direction of the base material 1 and in the width direction thereof is formed on the base material 1. Here, the plurality of line-shaped liquids 2 each forming a quadrangle is formed at positions sandwiched between the thin wire units formed earlier. Here, a line-shaped liquid 2 forming a quadrangle is disposed so as to be in contact with an outer conductive thin wire 3 of a thin wire unit adjacent to the line-shaped liquid 2, but not to be in contact with an inner conductive thin wire 3.

Figure 3D:
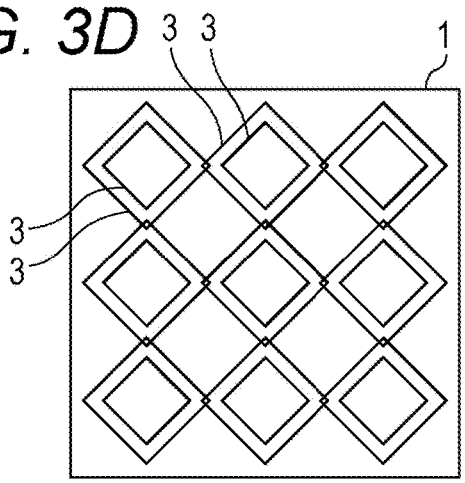
Figure 3E:
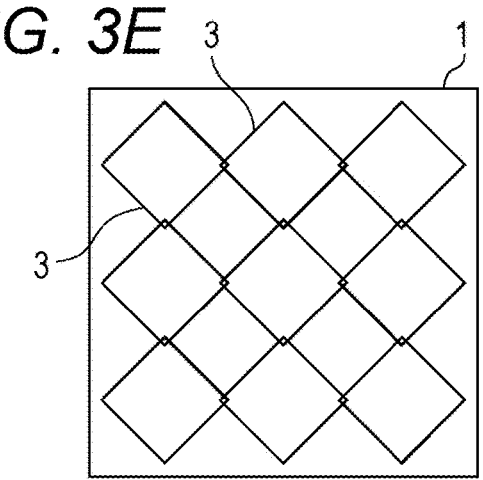

Subsequently, as illustrated in FIG. 3D, a thin wire unit formed of a pair of conductive thin wires 3 and 3 is further formed from each of the line-shaped liquids 2 by using the coffee stain phenomenon when the line-shaped liquids 2 are dried.

In the pattern illustrated in FIG. 3D, outer conductive thin wires 3 adjacent to each other are connected to each other. Meanwhile, an inner conductive thin wire 3 is not connected to another inner conductive thin wire 3 and is not connected to an outer conductive thin wire 3. That is, the inner conductive thin wires 3 are arranged so as to be isolated.

The pattern illustrated in FIG. 3D may be used as it is as a mesh pattern. In addition, the inner conductive thin wires 3 in the pattern illustrated in FIG. 3D may be removed to form a mesh pattern (FIG. 3E) formed of the outer conductive thin wires 3. According to the second aspect of the mesh pattern formation, the conductive thin wire 3 can be formed with a high degree of freedom. In particular, the arrangement interval of the plurality of conductive thin wires 3 can be set with a high degree of freedom without depending on the line width of the line-shaped liquid 2.

A method for removing the inner conductive thin wires 3 is not particularly limited, and for example, a method for irradiation with an energy ray such as a laser beam, a method for chemical etching, or the like can be used.

In addition, when the outer conductive thin wires 3 are electroplated, a method for removing the inner conductive thin wires 3 with a plating solution may be used. As described above, the inner conductive thin wires 3 are arranged so as to be isolated, and can be excluded from an energization path for electroplating the outer conductive thin wires 3. Therefore, while the outer conductive thin wires 3 are being electroplated (being energized), the inner conductive thin wires 3 not to be electroplated can be dissolved or decomposed by a plating solution and removed.

In the example of FIG. 3A-FIG. 3E, the line-shaped liquid 2 and the conductive thin wire 3 are each formed into a quadrangle, but the present invention is not limited thereto. Examples of the shape of each of the line-shaped liquid 2 and the conductive thin wire 3 include a closed geometric figure. Examples of the closed geometric figure include a polygon such as a triangle, a quadrangle, a hexagon, or an octagon. The closed geometrical figure can include a curve element such as a circle or an ellipse.

The base material is preferably heated when droplets formed of the conductive ink and applied onto the base material are dried. This further improves conductivity and transmittance of the conductive thin wire. A heating method is not particularly limited, and examples thereof include a method for heating a surface of the base material to a predetermined temperature. In this case, for example, by disposing a heater on a back surface side of a stage on which the base material used in the inkjet method is placed, the base material can be heated. Heating temperature is not particularly limited, but for example, the surface of the base material can be maintained at 40 to 90° C., 50 to 85° C., or furthermore 60 to 80° C. In particular, when the above-described coffee stain phenomenon is used, by heating the base material, thin wire formability is further improved.

The conductive thin wire formed on the base material can be post-treated as necessary. Examples of the post-treatment include a firing treatment and a plating treatment.

Examples of the firing treatment include a light irradiation treatment and a heat treatment. For the light irradiation treatment, for example, gamma rays, X-rays, ultraviolet rays, visible light, infrared rays (IR), microwaves, or radio waves can be used. For the heat treatment, for example, hot air, a heating stage, or a heating press can be used.

Examples of the plating treatment include electroless plating and electroplating. In the present embodiment, since generation of a bulge in the conductive thin wire is prevented, growth of a plating film by a plating treatment is uniform. In addition, since the conductive thin wire has excellent conductivity, in particular, electroplating can be uniformly performed. The plating treatment is preferably performed after a firing treatment, for example.

The line width of the conductive thin wire formed as described above can be appropriately set depending on a purpose and an application. The line width of the conductive thin wire can be, for example, 5 mm or less, 3 mm or less, 1 mm or less, or 100 µm or less. Particularly when the coffee stain phenomenon is used, as described above, the line width of the conductive thin wire can be 20 µm or less, 10 µm or less, 8 µm or less, or furthermore 5 µm or less. In addition, the line width of the conductive thin wire can be, for example, 0.1 µm or more, 0.5 µm or more, 1 µm or more, or furthermore 2 µm or more. The line width illustrated here can be applied to the line width of the conductive thin wire immediately after formation and the line width of the conductive thin wire after the post-treatment.

2. Method for Producing Transparent Conductor

In a method for producing a transparent conductor according to the present embodiment, a conductive thin wire constituting a transparent conductor is formed by the method for forming a conductive thin wire described above. The transparent conductor can be used, for example, as a transparent electrode. Such a transparent electrode can be used as an alternative to a transparent electrode such as an ITO electrode.

The transparent conductor can be constituted by a plurality of conductive thin wires arranged so as to form a pattern having a two-dimensional spread such as a stripe pattern or a mesh pattern as illustrated in FIGS. 2A-FIG. 2D and FIGS. 3A-FIG. 3E. In the transparent conductor, the plurality of conductive thin wires can be arranged in a planar shape as a whole. In this way, a planar transparent conductor, for example, a planar transparent electrode can be formed.

The planar transparent conductor can be constituted by conductive thin wires that contribute to conductivity and a space between the conductive thin wires, the space contributing to transparency. Even when the conductive material itself constituting the conductive thin wires is not transparent, favorable transparency is exhibited by allowing light to pass through the space.

In the present embodiment, favorable conductivity (decrease in surface resistance) and transparency are imparted to the transparent conductor by improving at least one of thin wire formability, conductivity, adhesion, and transmittance of the conductive thin wire.

The planar transparent conductor can have an area that can include, for example, a virtual square having a side length that is 300 times, 3000 times, or furthermore 30,000 times the line width of the conductive thin wire in the plane thereof, and can exhibit favorable conductivity and transparency over such a large area.

In the present embodiment, the base material is preferably transparent. This imparts transparency to the entire base material with the transparent conductor.

3. Method for Producing Device

In a method for producing a device according to the present embodiment, a conductive thin wire constituting a device is formed by the method for forming a conductive thin wire described above.

In the present embodiment, the conductive thin wire may constitute any element constituting the device, and may constitute, for example, an electric circuit element. Examples of the electric circuit element include electric wiring and an electrode.

As an example, such an electric circuit element can be formed by forming one or more conductive thin wires on a base material constituting a circuit board.

In the present embodiment, performance of the device can be favorably improved by improving at least one of thin wire formability, conductivity, adhesion, and transmittance of the conductive thin wire.

4. Set of Conductive Ink and Base Material

A set including the conductive ink described above and the base material described above is preferably used for forming a conductive thin wire on the base material using the conductive ink by the inkjet method. This makes the effect described for the method for forming a conductive thin wire exhibited.

EXAMPLES

Hereinafter, Examples of the present invention will be described, but the present invention is not limited by the Examples.

1. Preparation of Ink (1) Ink I 5 parts by weight of silver nanoparticles, 65 parts by weight of ethanol (log P=−0.31), 20 parts by weight of tripropylene glycol monomethyl ether (abbreviated as TPGME, log P=−0.2), and deionized water (the balance of 100 parts by weight of the total amount) were mixed, and the resulting mixture was used as ink I.

(2) Ink II 5 parts by weight of silver nanoparticles, 30 parts by weight of tripropylene glycol monomethyl ether, and deionized water (the balance of 100 parts by weight of the total amount) were mixed, and the resulting mixture was used as ink II.

(3) Ink III 5 parts by weight of silver nanoparticles, 30 parts by weight of 1,2-pentanediol (abbreviated as 1,2-PenDO, log P=0.2), and deionized water (the balance of 100 parts by weight of the total amount) were mixed, and the resulting mixture was used as ink III.

(4) Ink IV 5 parts by weight of silver nanoparticles, 20 parts by weight of diethylene glycol monobutyl ether (abbreviated as DEGBE, log P=0.29), and deionized water (the balance of 100 parts by weight of the total amount) were mixed, and the resulting mixture was used as ink IV.

(5) Ink V 1 part by weight of silver nanoparticles, 20 parts by weight of DEGBE, and deionized water (the balance of 100 parts by weight of the total amount) were mixed, and the resulting mixture was used as ink V.

(6) Ink VI 5 parts by weight of silver nanoparticles, 10 parts by weight of DEGBE, 20 parts by weight of 1,2-hexanediol (abbreviated as 1,2-HexDo, log P=0.69), and deionized water (the balance of 100 parts by weight of the total amount) were mixed, and the resulting mixture was used as ink VI.

2. Preparation of Base Material (1) Base Material I

The following pretreatment liquid 1 was applied onto a polyethylene terephthalate (PET) film, and a solvent was dried to form an undercoat layer, which was used as base material I. Base material I had surface energy of 33 [mN/m].

[Pretreatment Liquid 1]

10 parts by weight of water-based polyester-based emulsion ("Elitel KT-9204" manufactured by UNITIKA LTD.) as resin 1, 0.50 parts by weight of wax ("AQUACER 539" manufactured by BYK) as a repellent, and deionized water (the balance of 100 parts by weight of the total amount) were mixed, and the resulting mixture was used as pretreatment liquid 1.

[Measurement of Surface Energy]

Here, the surface energy is a value obtained by placing a droplet (about 5 μl) of ultrapure water and diiodomethane on a base material from a syringe and measuring a contact angle one second after dropping in an environment of 25° C. and 50% RH using DM-500 manufactured by Kyowa Interface Science Co., Ltd., and thereby calculating surface energy in a two-component system.

(2) Base Material II

The following pretreatment liquid 2 was applied onto a PET film, and a solvent was dried to form an undercoat layer, which was used as base material II. Base material II had surface energy of 39 [mN/m].

[Pretreatment Liquid 2]

15 parts by weight (solid content base) of acrylic resin (obtained by the following [Synthesis of resin 2]) as resin 2 and deionized water (the balance of 100 parts by weight of the total amount) were mixed, and the resulting mixture was used as pretreatment liquid 2.

[Synthesis of Resin 2]

While 18 parts by weight of deionized water and 3 parts by weight of an anionic surfactant ("Eleminol RS-3000" manufactured by Sanyo Chemical Industries, Ltd.; active ingredient 50%) were stirred, 6 parts by weight of glycidyl methacrylate and 34 parts by weight of acrylic acid were added thereto to prepare a monomer emulsion. Next, while 37.5 parts by weight of deionized water, 1 part by weight of the above anionic surfactant, and 0.5 parts by weight of potassium persulfate were stirred, nitrogen purge was performed. Thereafter, the resulting solution was heated to 75° C., and the above monomer emulsion was added dropwise thereto over four hours. After completion of dropwise adding, the reaction was allowed to proceed four more hours while temperature was maintained at 75 to 85° C., and then the reaction solution was cooled. After the reaction solution was cooled, deionized water was further added to obtain an acrylic resin having a non-volatile content of 25% by weight.

(3) Base Material III

The following pretreatment liquid 3 was applied onto a PET film, and a solvent was dried to form an undercoat layer, which was used as base material III. Base material III had surface energy of 36 [mN/m].

[Pretreatment Liquid 3]

15 parts by weight (solid content base) of a resin having a hydrophobic acrylic resin skeleton (obtained by the following [Synthesis of resin 3]) as resin 3 and deionized water (the balance of 100 parts by weight of the total amount) were mixed, and the resulting mixture was used as pretreatment liquid 3.

[Synthesis of Resin 3]

An acrylic resin (resin having a hydrophobic acrylic resin skeleton) into which a hydrophobic group (glycidyl group) had been introduced was obtained in a similar manner to the above [Synthesis of resin 2] except that the amount of glycidyl methacrylate was 35 parts by weight and 5 parts by weight of dodecyl methacrylate was used instead of acrylic acid.

(4) Base Material IV

A PET film having a clear hard coat (CHC) 1 was used as base material IV. Base material IV had surface energy of 56 [mN/m].

(5) Base Material V

A PET film having a clear hard coat (CHC) 2 was used as base material V. Base material V had surface energy of 31 [mN/m].

3. Formation of Conductive Thin Wire (1) Aspect of not Using Coffee Stain Phenomenon As Examples 1 to 10 and Comparative Examples 1 to 4, inks (I to VI) illustrated in Table 1 were applied onto base materials (I to V) illustrated in Table 1 by an inkjet method using an inkjet head ("KM1024iLHE-30" (standard droplet capacity 30 pL) manufactured by Konica Minolta Inc.), and dried to form a plurality of conductive thin wires. At this time, use of the coffee stain phenomenon was omitted, and a thin wire corresponding to an application range of the droplets (line-shaped liquid) applied in a line shape was formed. The plurality of conductive thin wires were formed so as to form a mesh pattern as a whole.

In Example 10, the base material was heated to 70° C. when the droplets formed of the ink applied onto the base material were dried. In the other Examples, heating was omitted.

(2) Aspect of Using Coffee Stain Phenomenon

As Example 11, Comparative Example 5, and Reference Example 1, inks (IV and V) illustrated in Table 2 were applied onto base materials (III to V) illustrated in Table 2 by an inkjet method using an inkjet head ("KM1024iLHE-30" (standard droplet capacity 30 pL) manufactured by Konica Minolta Inc.), and dried to form a plurality of conductive thin wires. At this time, when the line-shaped liquid formed of the ink applied onto the base material was dried by using the coffee stain phenomenon, a conductive material was selectively deposited on both edges of the line-shaped liquid to form conductive thin wires (parallel lines). The plurality of conductive thin wires was formed so as to form a mesh pattern as a whole.

In Example 11 and Reference Example 1, the base material was heated to 70° C. when the droplets formed of the ink applied onto the base material were dried. In the other Examples, heating was omitted.

(3) Measurement of Contact Angle

In the above Examples, Comparative Examples, and Reference Example, the forward contact angle θ1 and the backward contact angle θ2 of the ink to the base material were measured according to the following measurement method. The measured values are illustrated in Tables 1 and 2.

[Measurement of Forward Contact Angle θ1 and Backward Contact Angle θ2]

The forward contact angle θ1 and the backward contact angle θ2 were measured using a contact angle meter (contact angle meter "DM-500" manufactured by Kyowa Interface Science Co., Ltd.) in an environment of 25° C. and 50% RH. Specifically, droplets of the conductive ink were formed on the base material using a dispenser (auto dispenser "AD-31" manufactured by Kyowa Interface Science Co., Ltd.). The droplets were extruded at a rate of 3.5 µL/s. A maximum contact angle at which a contact line of the droplets did not move was measured as the forward contact angle θ1. Thereafter, the conductive ink constituting the droplets was sucked at a similar speed, and a minimum contact angle at which a contact line of the droplets did not move was measured as the backward contact angle θ2.

4. Evaluation Method

The following evaluation items were evaluated for Examples, Comparative Examples, and Reference Example.

(1) Thin Wire Formability

Thin wire formability was evaluated on the basis of the following evaluation criteria.

[Evaluation Criteria]

◎: A thin wire is formed without generation of a bulge, and a line width is 10 µm or less.

○: A thin wire is formed without generation of a bulge, and a line width exceeds 10 µm.

Δ: A bulge is generated in an extremely small part, but a thin wire is formed.

x: A bulge is generated, and a thin wire is not formed (disconnection).

(2) Surface Resistance

Surface resistance (also referred to as "sheet resistance value") [Ω/□] is a value measured by using a Loresta EP (MODEL MCP-T370 type) in-series 4-point probe (ESP) manufactured by Dia Instruments Co., Ltd. Prior to the above measurement, the conductive pattern was heated (fired) by heating the base material in a firing furnace at 125° C. for 10 minutes.

(3) Adhesion

The obtained conductive thin wire was further dried at 130° C. for 10 minutes. Thereafter, adhesion (bonding property) of the conductive thin wire to the base material was observed according to the so-called tape peeling test (cross-cut method) indicated in JIS K 5600-5-6, and evaluation was performed according to the following evaluation criteria.

[Evaluation Criteria]

◎: Test result classification 0 (no peeling occurs)

Δ: Test result classifications 1 and 2 (small peeling occurs)

x: Test result classifications 3 and 4 (large peeling occurs)

(4) Transmittance

Transmittance is a value obtained by measuring total light transmittance using AUTOMATIC HAZEMETER (MODEL TC-HIIIDP) manufactured by Tokyo Denshoku Co., Ltd. Note that transmittance is a value measured as total light transmittance of a pattern (mesh pattern) formed of conductive thin wires after correction using a base material.

Tables 1 and 2 illustrate the above results.

TABLE 1

| | | Example 1 | Example 2 | Example 3 | Example 4 | Example 5 | Example 6 | Example 7 | Example 8 | Example 9 | Example 10 | Comparative Example 1 | Comparative Example 2 | Comparative Example 3 | Comparative Example 4 |
|---|---|---|---|---|---|---|---|---|---|---|---|---|---|---|---|
| | Ink No. | I | II | II | III | III | IV | IV | III | IV | IV | II | II | VI | II |
| Ink composition [% by weight] | Silver nanoparticles | 5 | 5 | 5 | 5 | 5 | 5 | 5 | 5 | 5 | 5 | 5 | 5 | 5 | 5 |
| | Ethanol (logP = −0.31) | 65 | | | | | | | | | | | | | |
| | TPGME (logP = −0.2) | 20 | 30 | 30 | | | | | | | | 30 | 30 | | 30 |
| | 1,2-PenDO (logP = 0.2) | | | | 30 | 30 | | | 30 | | | | | | |
| | DEGBE (logP = 0.29) | | | | | | 20 | 20 | | 20 | 20 | | | 10 | |
| | 1,2-HexDO (logP = 0.69) | | | | | | | | | | | | | 20 | |
| | Water | Balance | Balance | Balance | Balance | Balance | Balance | Balance | Balance | Balance | Balance | Balance | Balance | Balance | Balance |
| Base material No. | | I | I | II | I | II | I | II | III | III | III | IV | V | V | V |
| Pretreatment liquid composition [% by weight] | Resin 1 | 15 | 15 | | 15 | | 15 | | | | | CHC1 | CHC2 | CHC2 | CHC2 |
| | Resin 2 | | | 15 | | 15 | | 15 | | | | | | | |
| | Resin 3 | | | | | | | | 15 | 15 | 15 | | | | |
| | Repellent | 0.50 | 0.50 | | 0.50 | | 0.50 | | | | | | | | |
| | Water | Balance | Balance | Balance | Balance | Balance | Balance | Balance | Balance | Balance | Balance | | | | |

TABLE 1-continued

|  |  | Example 1 | Example 2 | Example 3 | Example 4 | Example 5 | Example 6 | Example 7 | Example 8 | Example 9 | Example 10 | Comparative Example 1 | Comparative Example 2 | Comparative Example 3 | Comparative Example 4 |
|---|---|---|---|---|---|---|---|---|---|---|---|---|---|---|---|
|  | Surface energy [mN/m] | 33 | 33 | 39 | 33 | 39 | 33 | 39 | 36 | 36 | 36 | 56 | 31 | 31 | 31 |
|  | Forward contact angle θ1 [°] | 46 | 64 | 40 | 53 | 49 | 44 | 51 | 54 | 52 | 50 | 62 | 67 | 24 | 71 |
|  | Backward contact angle θ2 [°] | 29 | 36 | 31 | 30 | 29 | 25 | 24 | 28 | 17 | 15 | 37 | 51 | 11 | 57 |
|  | Heating of base material | Not heated | Not heated | Not heated | Not heated | Not heated | Not heated | Not heated | Not heated | Not heated | Heated | Not heated | Not heated | Not heated | Not heated |
|  | Line shape | Single line | Single line | Single line | Single line | Single line | Single line | Single line | Single line | Single line | Single line | Single line | Single line | Single line | Single line |
| Evaluation | Thin wire formability | ○ | Δ | Δ | Δ | Δ | ○ | ○ | Δ | ○ | ○ | Δ | × | Δ | × |
|  | Surface resistance (Ω/□) | 223 | 5.5 | 8.6 | 8.1 | 7.7 | 8.4 | 5.8 | 6.3 | 5.9 | 5.6 | 263 | — | 3115 | — |
|  | Adhesion | Δ | Δ | Δ | ○ | ○ | Δ | Δ | ○ | ○ | ○ | × | × | Δ | × |
|  | Transmittance [%] | 87.3 | 883 | 87.8 | 88.1 | 88.2 | 88.1 | 89.1 | 90.2 | 91.6 | 92.2 | 87.3 | 87.6 | 86.1 | 87.9 |

TABLE 21

|  |  | Example 11 | Comparative Example 5 | Reference Example 1 |
|---|---|---|---|---|
|  | Ink No. | V | IV | V |
| Ink composition [% by weight] | Silver nanoparticles | 1 | 5 | 1 |
|  | Ethanol (logP = −0.31) |  |  |  |
|  | TPGME (logP = −0.2) |  |  |  |
|  | 1,2-PenDO (logP = 0.2) |  |  |  |
|  | DEGBE (logP = 0.29) | 20 | 20 | 20 |
|  | 1,2-HexDO (logP = 0.69) |  |  |  |
|  | Water | Balance | Balance | Balance |
|  | Base material No. | III | V | IV |
| Pretreatment liquid composition [% by weight] | Resin 1 |  | CHC2 | CHC1 |
|  | Resin 2 |  |  |  |
|  | Resin 3 | 15 |  |  |
|  | Repellent |  |  |  |
|  | Water | Balance |  |  |
|  | Surface energy [mN/m] | 36 | 31 | 56 |
|  | Forward contact angle θ1 [°] | 50 | 55 | 26 |
|  | Backward contact angle θ2 [°] | 15 | 46 | 12 |
|  | Heating of base material | Heated | Not heated | Heated |
|  | Line shape | Parallel lines | Parallel lines | Parallel lines |
| Evaluation | Thin wire formability | ⊙ | × | ⊙ |
|  | Surface resistance (Ω/□) | 12 | — | 20.2 |
|  | Adhesion | ○ | × | Δ |
|  | Transmittance [%] | 96.2 | 89.3 | 94.3 |

5. Evaluation

Table 1 indicates that, in the aspect of not using the coffee stain phenomenon, Examples 1 to 10 using the method for forming a conductive thin wire according to the present invention can improve thin wire formability, conductivity, adhesion, and transmittance of a conductive thin wire as compared with Comparative Examples 1 to 4.

Table 2 indicates that, also in the aspect of using the coffee stain phenomenon, Example 11 using the method for forming a conductive thin wire according to the present invention can improve thin wire formability, conductivity, adhesion, and transmittance of a conductive thin wire as compared with Comparative Example 5 and Reference Example 1 (corresponding to Patent Literature 1).

REFERENCE SIGNS LIST

1 Base material
2 Line-shaped liquid
3 Conductive thin wire

The invention claimed is:
1. A method for forming a conductive thin wire on a base material by an inkjet method using a conductive ink containing at least a main solvent having a boiling point equal to or lower than a boiling point of water, a solvent having a boiling point higher than that of water, and a conductive material, wherein
the base material has surface energy of less than 40 mN/m, and conditions of $30° \leq \theta_1 \leq 70°$, $0° \leq \theta_2 \leq 40°$, and $\theta_2 < \theta_1$ are satisfied when a forward contact angle of the conductive ink to the base material is represented by $\theta_1$, and a backward contact angle of the conductive ink to the base material is represented by $\theta_2$, wherein the base material has an undercoat layer containing at least a resin containing a hydrophobic acrylic resin skeleton.

2. The method for forming a conductive thin wire according to claim 1, wherein a log P value of the solvent having a boiling point higher than that of water is larger than 0.

3. The method for forming a conductive thin wire according to claim 2, wherein when droplets formed of the conductive ink applied onto the base material are dried, the base material is heated.

4. The method for forming a conductive thin wire according to claim 2, wherein when droplets formed of the conductive ink applied onto the base material are dried, the conductive material is selectively deposited on edges of the droplets to form the conductive thin wire.

5. A method for producing a transparent conductor, wherein a conductive thin wire constituting a transparent conductor is formed by the method for forming a conductive thin wire according to claim 2.

6. A method for producing a device, wherein a conductive thin wire constituting a device is formed by the method for forming a conductive thin wire according to claim 2.

7. The method for forming a conductive thin wire according to claim 1, wherein when droplets formed of the conductive ink applied onto the base material are dried, the base material is heated.

8. The method for forming a conductive thin wire according to claim 7, wherein when the droplets formed of the conductive ink applied onto the base material are dried, the conductive material is selectively deposited on edges of the droplets to form the conductive thin wire.

9. A method for producing a transparent conductor, wherein a conductive thin wire constituting a transparent conductor is formed by the method for forming a conductive thin wire according to claim 7.

10. A method for producing a device, wherein a conductive thin wire constituting a device is formed by the method for forming a conductive thin wire according to claim 7.

11. The method for forming a conductive thin wire according to claim 1, wherein when droplets formed of the conductive ink applied onto the base material are dried, the conductive material is selectively deposited on edges of the droplets to form the conductive thin wire.

12. A method for producing a transparent conductor, wherein a conductive thin wire constituting a transparent conductor is formed by the method for forming a conductive thin wire according to claim 1.

13. A method for producing a device, wherein a conductive thin wire constituting a device is formed by the method for forming a conductive thin wire according to claim 1.

14. A set of a conductive ink and a base material, wherein
the conductive ink contains at least a main solvent having a boiling point equal to or lower than a boiling point of water, a solvent having a boiling point higher than that of water, and a conductive material,
the base material has surface energy of less than 40 mN/m,
conditions of $30° \leq \theta_1 \leq 70°$, $0° \leq \theta_2 \leq 40°$, and $\theta_2 < \theta_1$ are satisfied when a forward contact angle of the conductive ink to the base material is represented by $\theta_1$, and a backward contact angle of the conductive ink to the base material is represented by $\theta_2$, and
the set of the conductive ink and the base material is used for forming a conductive thin wire on the base material by an inkjet method using the conductive ink,
wherein the base material has an undercoat layer containing at least a resin containing a hydrophobic acrylic resin skeleton.

* * * * *